(12) United States Patent
Kimura

(10) Patent No.: US 7,414,384 B2
(45) Date of Patent: Aug. 19, 2008

(54) SERIES REGULATOR CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 37 days.

(21) Appl. No.: 11/689,504

(22) Filed: Mar. 21, 2007

(65) Prior Publication Data

US 2007/0222425 A1  Sep. 27, 2007

(30) Foreign Application Priority Data

Mar. 27, 2006  (JP) ............................. 2006-085896

(51) Int. Cl.
*G05F 1/56* (2006.01)
*G05F 3/16* (2006.01)
(52) U.S. Cl. ...................... 323/274; 323/314
(58) Field of Classification Search ................. 323/273, 323/274, 275, 279, 281, 311, 312, 313, 314
See application file for complete search history.

(56) References Cited

U.S. PATENT DOCUMENTS

| | | | | |
|---|---|---|---|---|
| 4,282,477 A | * | 8/1981 | Ahmed | 323/312 |
| 5,550,462 A | * | 8/1996 | Nakajima | 323/277 |
| 7,173,401 B1 | * | 2/2007 | Huang | 323/277 |

FOREIGN PATENT DOCUMENTS

| | | |
|---|---|---|
| JP | 9-265330 A | 10/1997 |
| JP | 2000-31807 A | 1/2000 |
| JP | 2002-343874 | 11/2002 |

OTHER PUBLICATIONS

National Semiconductor, LMS33460M 3V Under Voltage Detector, http://cache.national.com/ds/LM/LMS33460.pdf.

* cited by examiner

*Primary Examiner*—Gary L Laxton
(74) *Attorney, Agent, or Firm*—Charles Bergere

(57) ABSTRACT

A series regulator circuit that enables detection of a voltage drop and reduces consumed current in a static state. A constant current source, which is connected to a power supply voltage line, is connected to a bipolar transistor. The bipolar transistor includes an emitter terminal and base terminal connected to a ground line via first and second resistors, respectively. The constant current source is connected to the source terminal of a PMOS transistor and the gate terminal of an NMOS transistor. The source terminal of the NMOS transistor is connected via third and fourth resistors to the base terminal of the bipolar transistor.

5 Claims, 4 Drawing Sheets

SERIES REGULATOR CIRCUIT

BACKGROUND OF THE ART

The present invention relates to a series regulator circuit having a function for detecting voltage drops.

In the prior art, voltage instability that occurs when a circuit is activated may result in operational defects. To prevent such defects, a power-on reset circuit that outputs a reset signal for initializing the operation of each circuit when the voltage becomes stable has been proposed (for example, refer to Japanese Laid-Open Patent Publication No. 2000-31807, FIG. 2). The power-on reset circuit described in Japanese Laid-Open Patent Publication No. 2000-31807 includes a reference voltage generator for generating a reference voltage, a power supply voltage detector for generating activation voltage proportional to the power supply voltage, and a reset signal generator for comparing the reference voltage and the activation voltage to generate a reset signal. The reset signal generator outputs a first logic state until the power supply voltage reaches a predetermined level and a second logic state when the power supply voltage reaches the predetermined level. When outputting the second logic state, after a delay caused by a delay circuit, the reset circuit is inactivated and the second logic state is maintained.

A voltage drop detection circuit has been proposed as a circuit that switches signals in accordance with the level of a power supply voltage (for example, refer to National Semiconductor "LMS33460 3V Under Voltage Detector", [online], searched on Jan. 26, 2006, Internet <URL: http://www.national.com/ds/LM/LMS33460.pdf>.) The voltage drop detection circuit detects voltage drops resulting from short-circuits or the like caused by one reason or another. This is effective for avoiding defects such as a voltage drop that may be caused by a sudden increase in load current. Referring to FIG. 3, a voltage drop detection circuit 100 includes a comparator 102 for comparing constant voltage Vref of a constant voltage source 101 with voltage decreased from input voltage VIN by an amount corresponding to the voltage drop caused by a resistor R. The comparator 102 has an output terminal connected to a gate terminal of an n-channel MOS transistor 103. Thus, the comparator 102 provides the MOS transistor 103 with a comparison result of the constant voltage Vref. As a result, the output voltage Vo changes in accordance with the voltage at the gate terminal of the MOS transistor 103. This enables the detection of a voltage drop.

In the prior art, a series regulator is used to ensure a constant output voltage even if the input voltage fluctuates (for example, refer to Japanese Laid-Open Patent Publication No. 9-265330, FIG. 1 and Japanese Laid-Open Patent Publication No. 2002-343874, FIG. 1). Japanese Laid-Open Patent Publication No. 9-265330 describes a reference potential generation circuit that uses a series regulator as a constant current source. The structure of the series regulator will now be described with reference to FIG. 4. A series regulator circuit 110 includes a constant current source 111, which is connected to a power supply voltage line VDD, and the collector terminal of a bipolar transistor 112. The emitter terminal of the transistor 112 is connected to a ground line GND via a resistor 113.

The series regulator circuit 110 includes an n-channel MOS transistor 114, which has a drain terminal connected to a power supply voltage line VDD. The MOS transistor 114 has a source terminal connected to the ground line GND via resistors 115 and 116 and the voltage here serves as output voltage Vout. Furthermore, the gate terminal of the MOS transistor 114 is connected to a connection node between the constant current source 111 and the collector terminal of the transistor 112. A connection node of resistors 115 and 116 is connected to the base terminal of the transistor 112.

The output voltage Vout of the series regulator circuit 110 is in accordance with a load current. When an increase in the load current decreases the output voltage, the base voltage Vbg applied to the base terminal of the transistor 112 decreases and accordingly reduces the collector current. In this case, the voltage at the collector terminal, or the voltage at the gate terminal of the MOS transistor 114 increases. This lowers the resistance between the drain and source of the MOS transistor 114 and increases the output voltage Vout. That is, the resistance of the MOS transistor 114 connected in series to the resistors 115 and 116 decreases so as to keep the output voltage Vout substantially constant.

Japanese Laid-Open Patent Publication No. 2002-343874 describes a series regulator circuit having another structure. FIG. 5 shows the structure of the series regulator circuit 120, which includes a constant voltage source 121, an operational amplifier 122, and an n-channel MOS transistor 123. The MOS transistor 123 has a drain terminal connected to power supply voltage line VDD, a source terminal connected to a ground line GND via resistors 124 and 125, and a gate terminal connected to an output terminal of the operational amplifier 122. When the voltage at the connection node of the resistors 124 and 125 decreases, a constant voltage Vref of the constant voltage source 121 changes the gate voltage of the MOS transistor 123 to increase the output voltage Vout. On the other hand, when the voltage at the connection node of the resistors 124 and 125 increases, the constant voltage Vref changes the gate voltage of the MOS transistor 123 to decrease the output voltage Vout. This keeps the output voltage Vout substantially constant.

The purpose of the above-described voltage drop detection circuit 100 and series regulator circuits 110 and 120 is to stabilize circuit operations when the output voltage Vout fluctuates. Accordingly, these circuits may be used in combination to form an integrated circuit.

As an example, FIG. 6 shows a series regulator circuit 150 that functions to detect voltage drops. The series regulator circuit 150 is formed by combining the voltage drop detection circuit 100 shown in FIG. 3 and the series regulator circuit 110 shown in FIG. 4. More specifically, the series regulator circuit 150 includes a constant voltage source 101 and a comparator 102, which compares the constant voltage Vref of the constant voltage source 101 with the output voltage Vout of the series regulator circuit 110. Accordingly, when the output voltage Vout becomes less than the constant voltage Vout, the series regulator circuit 150 outputs a step down voltage detection Vud from the comparator 102.

A series regulator circuit 160 shown in FIG. 7 may also be used to detect voltage drops. The series regulator circuit 160 is formed by combining the voltage drop detection circuit 100 shown in FIG. 3 and the series regulator circuit 120 shown in FIG. 5. More specifically, the series regulator circuit 160 supplies the constant voltage of a constant voltage source 121 to one of the input terminals of an operational amplifier 122 and one of the input terminals of a comparator 102. The other input terminal of the operational amplifier 122 is connected to a connection node between resistors 162 and 125, and the output terminal of the operational amplifier 122 is connected to the gate terminal of an n-MOS transistor 123. The source terminal of the MOS transistor 123 has the output voltage Vout and is connected to ground GND via resistors 161, 162, and 125. Further, the other input terminal of the comparator 102 is connected to a connection node of the resistors 161 and 162.

In the series regulator circuits 150 and 160, like or same reference numerals are given to those components that are the same as the corresponding components in the voltage drop detection circuit 100 and the series regulator circuits 110 and 120.

The consumed current of the series regulator circuit 150 shown in FIG. 6 in a static state is represented by IDDQ1. In this case, the consumed current IDDQ1 is the total value of the current Ip flowing through the constant current source 111 and transistor 112, the current IB flowing through the MOS transistor 114, the current IR consumed by the constant voltage source 101, and the current IC consumed by the comparator 102.

The consumed current of the series regulator circuit 160 shown in FIG. 7 in a static state is represented by IDDQ2. In this case, the consumed current IDDQ2 is the total value of the current IR consumed by the constant voltage source 121, the current IOP consumed by the operational amplifier 122, the current IB flowing through the MOS transistor 123, and the current IC consumed by the comparator 102.

Such series regulator circuits can be reduced in size by integrating circuits. However, the consumed current of these circuits must further be reduced.

SUMMARY OF THE INVENTION

The present invention provides a series regulator circuit that enables detection of voltage drops while reducing consumed current in a static state.

One aspect of the present invention is a series regulator circuit including a first transistor connected between a constant current source, which is connected to a power supply line, and a ground line. A second transistor is connected between the power supply line and an output terminal. A first resistor, second resistor, and third resistor are connected in series between the output terminal and the ground line. A comparator compares voltage at the output terminal with voltage at a reference node between the first and second resistors. The first transistor has a control terminal connected between the second and third resistors, and the second transistor has a control terminal connected between the constant current source and the first transistor. The control terminal of the second transistor is connected to a switch element for supplying a trigger current when the voltage at the output terminal decreases. A backup current supplying means supplies the reference node with backup current corresponding to the trigger current.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A preferred embodiment of the present invention will now be described with reference to FIGS. 1 and 2.

Figure 1:
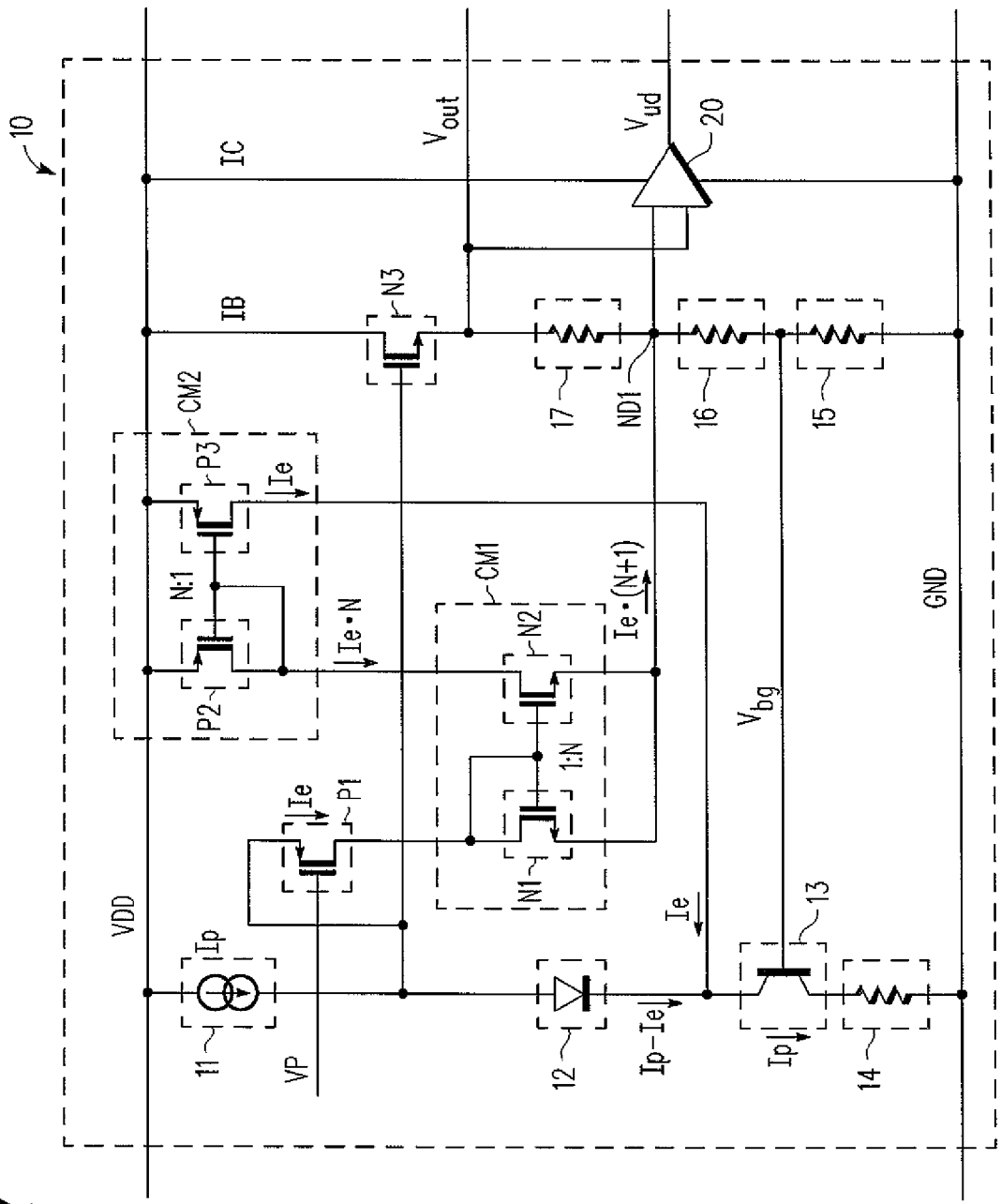
FIG. 1 is a circuit diagram of a series regulator circuit according to the present invention.
Figure 2:
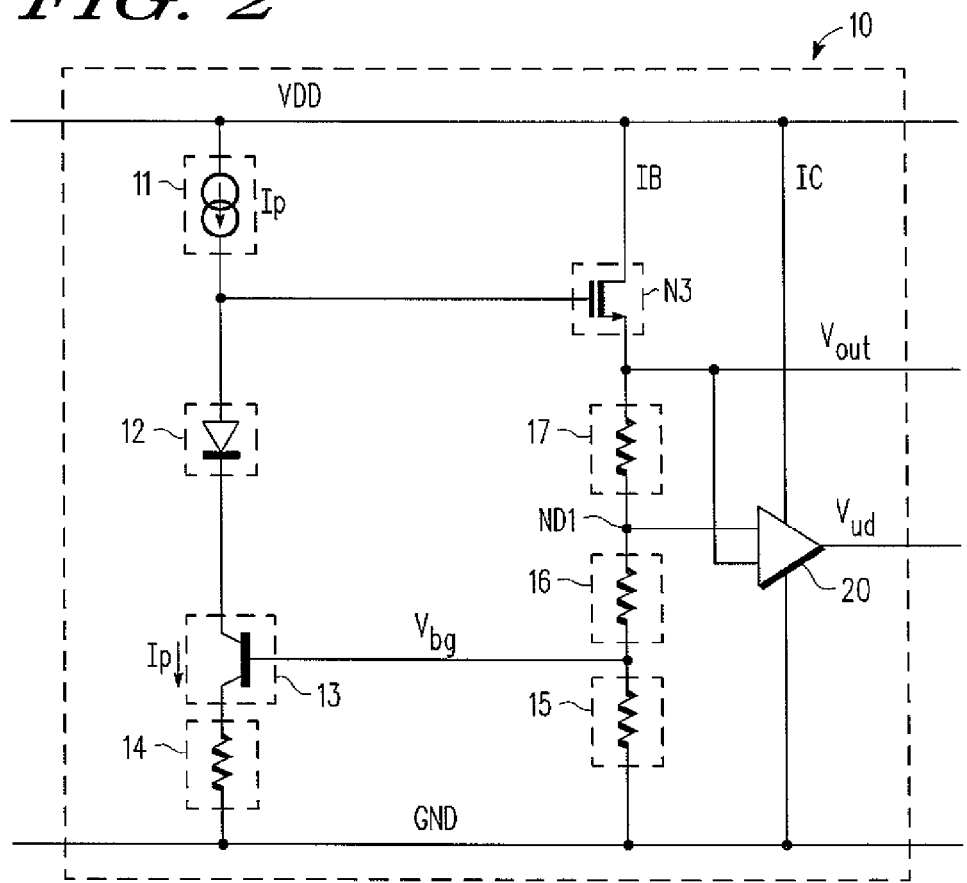
FIG. 2 is an equivalent circuit diagram of the series regulator circuit shown in FIG. 1 during a normal operation.
Figure 3:
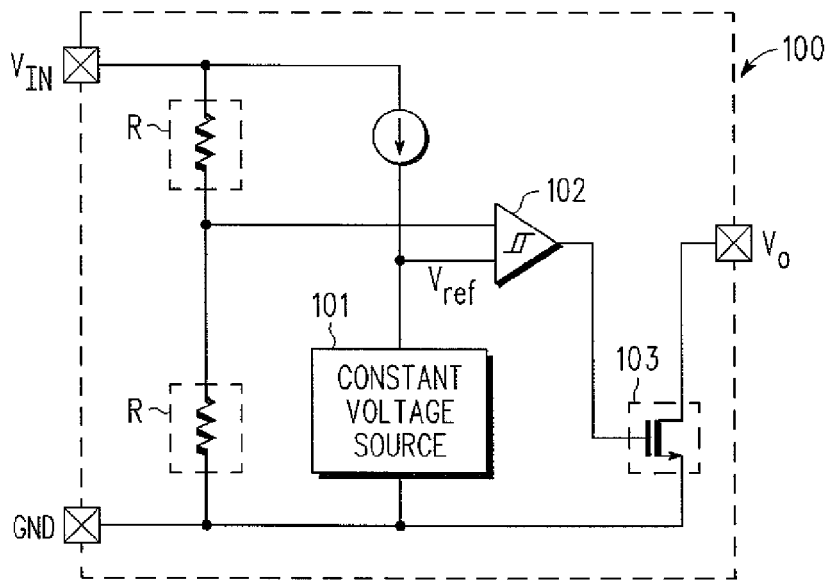
FIG. 3 is a circuit diagram showing a voltage drop detection circuit in the prior art.
Figure 4:
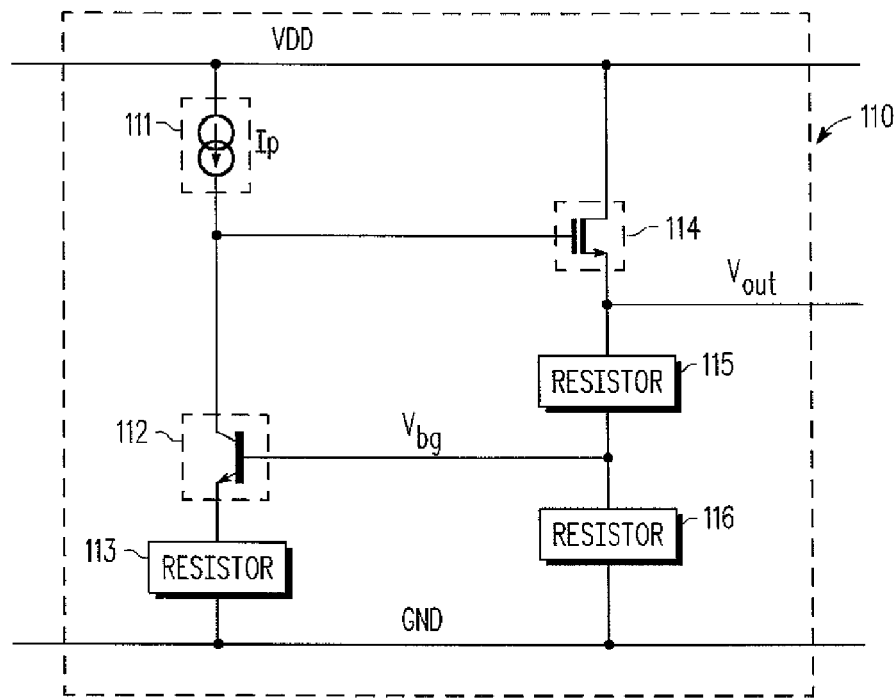
FIG. 4 is a circuit diagram of a series regulator circuit in the prior art.
Figure 5:
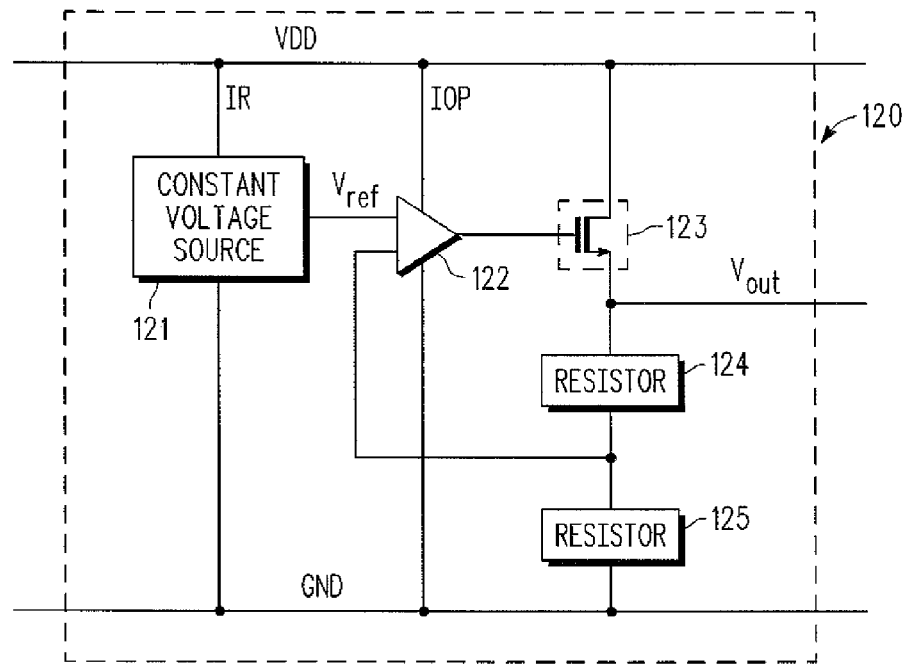
FIG. 5 is a circuit diagram of a further series regulator circuit in the prior art.
Figure 6:
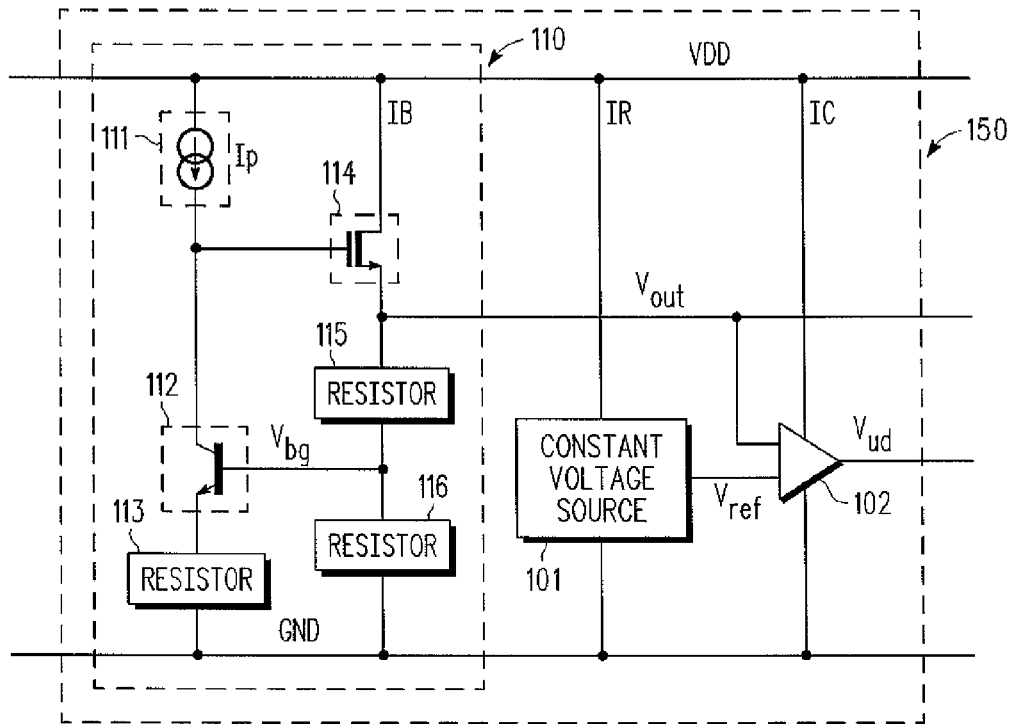
FIG. 6 is a circuit diagram of a series regulator circuit that can be contemplated from the prior art.
Figure 7:
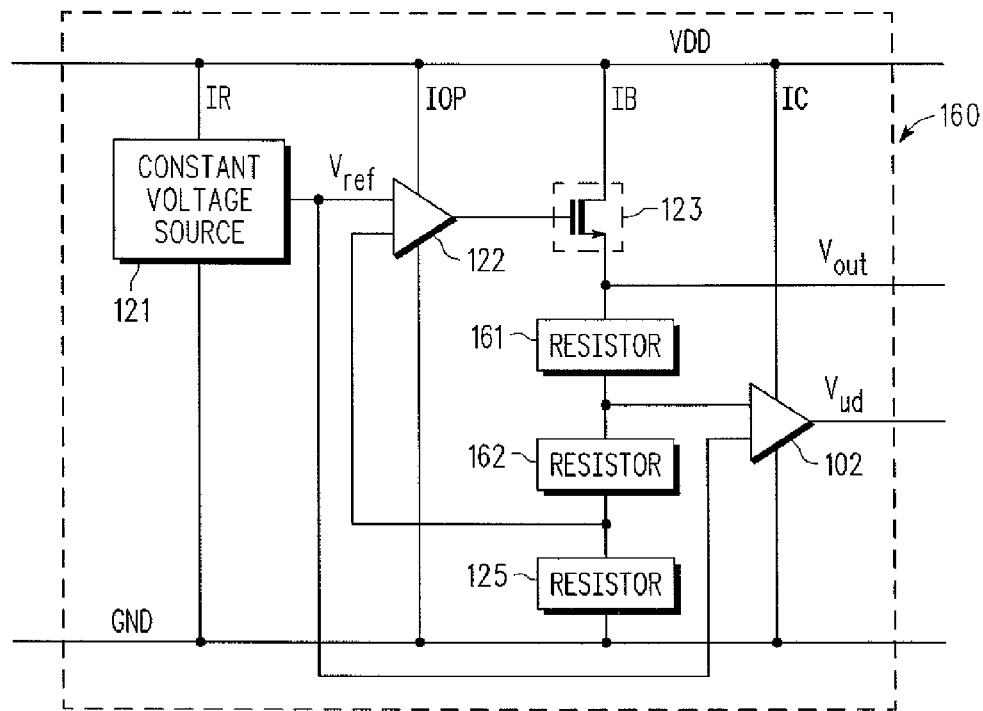
FIG. 7 is a circuit diagram of a further series regulator circuit that can be contemplated from the prior art.

Referring to FIG. 1, a series regulator circuit 10 of the present embodiment includes constant current source 11 connected to a power supply voltage line VDD and supplying current having current value Ip. The constant current source 11 is connected to a collector terminal of a bipolar transistor 13 via a diode 12, which functions as a rectifying means. The diode 12 prevents reverse flow of current from the bipolar transistor 13 to the constant current source 11.

The bipolar transistor 13 functions as a first transistor and includes an emitter terminal connected to a ground line GND via a resistor 14. The bipolar transistor 13 has a base terminal functioning as a control terminal connected to the ground line GND via a resistor 15, which functions as a third resistor. In the present embodiment, the bipolar transistor 13 has temperature dependent characteristics. Thus, a constant current source having temperature dependent characteristics is used as the constant current source 11 so as to compensate for the transistor characteristics.

An n-channel MOS transistor N3 includes a gate terminal functioning as a control terminal connected between the constant current source 11 and the anode terminal of the diode 12. The MOS transistor N3, which functions as a second transistor, includes a drain terminal connected to a power supply voltage line VDD and a source terminal connected to the base terminal of the bipolar transistor 13 via series-connected resistors 17 and 16. The source terminal of the MOS transistor N3 also functions as an output terminal of the series regulator circuit 10. Thus, the voltage at the source terminal of the MOS transistor N3 is output as the output voltage Vout of the series regulator circuit 10.

The source terminal of the MOS transistor N3 is further connected to one of the input terminals of a comparator 20. The other input terminal of the comparator 20 is connected to a connection node ND1 of the resistors 17 and 16. The resistor 17 functions as a first resistor, the resistor 16 functions as a second resistor, and the connection node ND1 functions as a reference node. The comparator 20 compares the voltage at the source terminal of the MOS transistor N3 with the voltage at the connection node ND1 The comparator 20 outputs from the output terminal a voltage drop detection voltage Vud having a high level when the output voltage Vout becomes lower than the voltage at the connection node ND1 (hereafter referred to as reference voltage).

The anode terminal of the diode 12 is connected to the source terminal of a p-channel MOS transistor P1, which functions as a switch element. Control voltage VP is applied to the gate terminal of the MOS transistor P1. In the present embodiment, the control voltage VP takes a value that is lower that the voltage at the source terminal by an amount corresponding to the threshold value when exceeding a predetermined range. The predetermined range is the range in which the output voltage Vout can be controlled by the MOS transistor N3 to remain substantially constant. That is, the MOS transistor P1 is activated when the voltage at the source terminal (gate terminal voltage of MOS transistor N3) becomes greater than the control voltage VP by an amount corresponding to the threshold value. This generates a flow of trigger current. Further, the drain terminal of the MOS transistor P1 is connected to a first current mirror circuit CM1, which functions as a backup current supplying means.

The first current mirror circuit CM1 includes two n-channel MOS transistors N1 and N2. The drain terminal of the MOS transistor N1 is connected to the drain terminal of the MOS transistor P1 and to the gate terminals of the MOS transistors N1 and N2. Further, the source terminals of the MOS transistors N1 and N2 are connected to a connection node ND1. The MOS transistor N2, which has a size that is N times greater than the MOS transistor N1, is connected to the power supply voltage line VDD via a second current mirror circuit CM2 functioning as a compensation current supplying means. Accordingly, the first current mirror circuit CM1 supplies connection node ND1 with trigger current having current value Ie through a line connecting MOS transistors P1 and N1 and backup current having a current value that is N times greater than the trigger current (Ie·N) through a line including the MOS transistor N2.

The second current mirror circuit CM2 includes two p-channel MOS transistors P2 and P3. The source terminals of the MOS transistors P2 and P3 are connected to the power supply voltage line VDD. Further, the drain terminal of the MOS transistor P2 is connected to the drain terminal of the MOS transistor N2 in the first current mirror circuit CM1 and to the gate terminals of the MOS transistors P2 and P3. The MOS transistor P3 has a size that is 1/N the size of the MOS transistor P2. The drain terminal of the MOS transistor P3 is connected to a connection node between the cathode terminal of the diode 12 and the collector terminal of the bipolar transistor 13. Accordingly, the second current mirror circuit CM2 supplies through the MOS transistor P3 the compensation current of 1/N the backup current flowing through the MOS transistors P2 and N2. As a result, the second current mirror circuit CM2 supplies the cathode terminal of the diode 12 with compensation current having the same value Ie as the trigger current.

The operation of the series regulator circuit 10 will now be discussed. Operations based on fluctuations in the load current will be described below. However, the same will apply for operations based on fluctuations in the power supply voltage VDD.

First, in the series regulator circuit 10, a case in which the load current fluctuates within a predetermined range when the output current is within a specified range will be described. In this case, the control voltage VP at the gate terminal of the MOS transistor P1 is less than the voltage at the anode terminal of the diode 12. Thus, the MOS transistor P1 is inactivated, and current does not flow through the first and second current mirror circuits CM1 and CM2. FIG. 2 shows an equivalent circuit for such a case. Referring to FIG. 2, in a state in which the MOS transistor P1 is inactivated, feedback to the bipolar transistor 13 is performed via the MOS transistor N3 so as to keep the output voltage Vout constant.

For example, a decrease in the load current within a predetermined range increases the output voltage Vout. In this state, the base voltage Vbg of the bipolar transistor 13 increases. Thus, the collector current of the bipolar transistor 13 increases. As a result, the gate terminal voltage of the MOS transistor N3 decreases. This decreases the source voltage of the MOS transistor N3. Accordingly, the MOS transistor N3 keeps the output voltage Vout substantially constant.

When the load current increases within the predetermined range, the base voltage Vbg of the bipolar transistor 13 decreases. In this case, the collector current of the bipolar transistor 13 decreases, and the gate terminal voltage of the MOS transistor N3 increases. This increases the source voltage of the MOS transistor N3 and keeps the output voltage Vout substantially constant.

When the load current decreases or increases in the predetermined range in this manner, the MOS transistor N3 functions to cancel the voltage fluctuation and keep the output voltage Vout substantially constant. In such a state, the MOS transistor P1 is inactivated and the first mirror circuit CM1 does not function. Thus, current is not supplied to the connection node ND1. In this case, the voltage at the connection node ND1 is maintained at a voltage that is less than the output voltage Vout for an amount corresponding to the voltage drop caused by the resistor 17. More specifically, since the output voltage Vout is higher than the reference voltage, the comparator 20 outputs the voltage drop detection voltage Vud as a signal (low level) indicating that there is no voltage fluctuation.

Next, a case in which a flow of excessive load current occurs will be discussed. For example, when a short-circuit or the like occurs and produces load current exceeding the predetermined range, the output voltage Vout decreases. In this case, the MOS transistor N3 functions to keep the output voltage Vout substantially constant as described above as the load current increase until exceeding the predetermined range. When the load current further increases and exceeds the predetermined range, the bipolar transistor 13 functions to further increase the gate terminal voltage of the MOS transistor N3. When the source terminal voltage of the MOS transistor P1, which is connected to the gate terminal of the MOS transistor N3, becomes higher than the control voltage VP by an amount corresponding to the threshold value, the MOS transistor P1 is activated. This produces a flow of trigger current having the current value Ie with the MOS transistor P1. As a result, the trigger current flows through the MOS transistor N1 of the first current mirror circuit CM1, and backup current having the current value Ie·N flows through the MOS transistor N2. The first current mirror circuit CM1 supplies the trigger current and the backup current to the connection node ND1.

The backup current of the MOS transistor N2 in the first current mirror circuit CM1 is supplied from the power supply voltage line VDD via the MOS transistor P2 of the second current mirror circuit CM2. In this case, the compensation current, the amount of which is the same as the trigger current, flows through the MOS transistor P3 of the second current mirror circuit CM2. The compensation current flowing through the MOS transistor P3 is supplied to the collector terminal of the bipolar transistor 13. The diode 12 prevents the reversed flow of the compensation current.

Since the trigger current flows through the MOS transistor P1, a current having current value Ip-Ie flows through the diode 12. The MOS transistor P3 supplies the collector terminal of the bipolar transistor 13 with the compensation current having the same current value Ie as the trigger current. Thus, the collector current of the bipolar transistor 13 becomes equal to current value Ip. This stabilizes the operation of the bipolar transistor 13 and keeps the potential at the connection node ND1 constant. In other words, the trigger current and backup current flow from the first current mirror circuit CM1 so that the voltage at the connection node ND1 becomes constant. In this case, the comparator 20 detects that the output voltage Vout is lower than the voltage (reference voltage) at the connection node ND1. More specifically, the comparator 20 outputs the voltage drop detection voltage Vud as a signal (high level) indicating voltage fluctuation. This enables the series regulator circuit 10 to detect the voltage drop in the output voltage Vout of the series regulator circuit 10.

The preferred embodiment has the advantages described below.

In the preferred embodiment, the bipolar transistor 13 is connected between the constant current source 11, which is connected to the power supply voltage line VDD, and the ground line GND. The base terminal of the bipolar transistor 13 is connected to the ground line GND via the resistor 15. The gate terminal of the MOS transistor N3 is connected to the constant current source 11. The source terminal of the MOS transistor N3 functions as an output terminal of the series regulator circuit 10 and is connected to the base terminal of the bipolar transistor 13 via the series-connected resistors 17 and 16. The comparator 20, which is connected to the output terminal and the connection node ND1, outputs a high level signal, or the voltage drop detection voltage Vud, when the output voltage Vout becomes lower than the voltage at the connection node ND1. Thus, when the load current fluctuates within the predetermined range, the MOS transistor N3 and the bipolar transistor 13 cooperate so that the output voltage Vout of the series regulator circuit 10 becomes substantially constant. In this case, the current consumed by the series regulator circuit 10 (current in static state) is the total value of the current having current value Ip flowing through the constant current source 11 and the bipolar transistor 13, the current IB flowing through the MOS transistor N3, and the current IC consumed by the comparator 20. Accordingly, the consumed current is reduced.

Further, the source terminal of the MOS transistor P1 is connected between the constant current source 11 and the bipolar transistor 13. The MOS transistor P1 is activated when the voltage at the source terminal becomes greater than the control voltage VP by an amount corresponding to the threshold value. As a result, the trigger current flows through the connection node ND1. The first current mirror circuit CM1 causes the backup current, which is in accordance with the trigger current, to flow through the connection node ND1. Thus, the supply of the trigger current and the backup current keeps the reference voltage at the connection node ND1 substantially constant even if the load current exceeds the predetermined range. Accordingly, the comparator 20 compares the substantially constant reference voltage and output voltage Vout to output the voltage drop detection voltage Vud. This ensures the detection of a fluctuation in the output voltage Vout.

In the preferred embodiment, some of the current supplied to the bipolar transistor 13 from the constant current source 11 is used as the trigger current. To reduce the consumed current, when decreasing the current flowing through a line including the constant current source 11 and the bipolar transistor 13, the trigger current, which is part of the current flowing through the line, also becomes small. By using the first current mirror circuit CM1, which generates the backup current and causes the backup current to flow to the connection node ND1, the reference voltage is maintained constant by supplying the backup current even if the trigger current is small.

In the preferred embodiment, the first current mirror circuit CM1 supplies the connection node ND1 with the trigger current, which flows through the MOS transistor P1, and the backup current, which is N times greater than the trigger current Further, the second current mirror circuit CM2 generates the compensation current, which is 1/N the backup current supplied by the first current mirror circuit CM1, and supplies the collector terminal of the bipolar transistor 13 with the compensation current. That is, the compensation current takes the same current value Ie as the trigger current. Further, the diode 12 functions to supply current from the constant current source 11 to the bipolar transistor 13 in the same direction. Accordingly, the compensation current having the same current value Ie as the trigger current flowing from the MOS transistor P1 is returned from the second current mirror circuit CM2 to the current flowing from the constant current source 11 to the bipolar transistor 13. Thus, the collector current of the bipolar transistor 13 is kept constant even if the load current fluctuates. Further, the operation of the bipolar transistor 13 is stabilized. Therefore, the series regulator circuit 10 accurately detects voltage drops.

In the preferred embodiment, the constant current source 11 has temperature dependent characteristics. Thus, even if the bipolar transistor 13 has temperature dependent characteristics, the transistor characteristics are compensated for to keep the output voltage Vout and the reference voltage substantially constant. Further, the resistor 14, which is connected to the bipolar transistor 13, has temperature dependent characteristics. Thus, the resistor 14 cooperates with the constant current source 11 to further compensate for the temperature dependent characteristics of the bipolar transistor 13.

It should be apparent to those skilled in the art that the present invention may be embodied in many other specific forms without departing from the spirit or scope of the invention. Particularly, it should be understood that the present invention may be embodied in the following forms.

In the preferred embodiment, the first current mirror circuit CM1 is used to supply current to the connection node ND1 when the MOS transistor P1 is activated. However, the circuit that supplies current to the connection node ND1 when the MOS transistor P1 is activated is not limited to a current mirror circuit. For example, an amplification circuit that functions to supply current when the MOS transistor P1 is activated may be used instead.

In the preferred embodiment, to keep the voltage at the base terminal of the bipolar transistor 13 constant, the compensation current having the same current value Ie as the trigger current, which flows from the anode terminal of the diode 12 to the MOS transistor P1, is supplied from the second current mirror CM2 to the collector terminal of the bipolar transistor 13. By supplying the trigger current to the MOS transistor P1, when a change in the base voltage Vbg of the bipolar transistor 13 is small, the second current mirror circuit CM2 and the diode 12 may be eliminated. This would simplify the structure of the series regulator circuit 10.

In the preferred embodiment, the comparator 20 outputs the voltage drop detection voltage Vud at a high level from the output terminal when the output voltage Vout becomes lower than the reference voltage of the connection node ND1. Instead, the comparator 20 may output the voltage drop detection voltage Vud at a low level when the output voltage Vout becomes lower than the reference voltage of the connection node ND1 In other words, the comparator only needs to have a structure that shifts its output signal when the output voltage becomes lower than the reference voltage at the connection node ND1.

The present examples and embodiments are to be considered as illustrative and not restrictive, and the invention is not to be limited to the details given herein, but may be modified within the scope and equivalence of the appended claims.

The invention claimed is:

1. A series regulator circuit comprising:
  a first transistor connected between a constant current source, which is connected to a power supply line, and a ground line;

a second transistor connected between the power supply line and an output terminal;

a first resistor, second resistor, and third resistor connected in series between the output terminal and the ground line;

a comparator for comparing voltage at the output terminal with voltage at a reference node between the first and second resistors, wherein the first transistor has a control terminal connected between the second and third resistors, and the second transistor has a control terminal connected between the constant current source and the first transistor, the control terminal of the second transistor being connected to a switch element for supplying a trigger current when the voltage at the output terminal decreases; and a backup current supplying means for supplying the reference node with backup current corresponding to the trigger current.

2. The series regulator according to claim 1, further comprising:

a compensation current supplying means for supplying a node between the constant current source and the first transistor with a compensation current corresponding to the trigger circuit.

3. The series regulator according to claim 2, further comprising a rectifying means arranged between the constant current source and the node connected to the compensation current supplying means.

4. The series regulator according to claim 2, wherein the backup current supplying means and the compensation current supplying means is formed by a current mirror circuit, and the compensation current supplying means supplies the backup current at a value that is greater by an inverse of the amplification of the backup current supplying means.

5. The series regulator according to claim 1, wherein the constant current source is a current source having temperature dependency that compensates for temperature dependency of the first transistor.

* * * * *